United States Patent [19]

Tsuzuki et al.

[11] 4,092,445
[45] May 30, 1978

[54] PROCESS FOR FORMING POROUS SEMICONDUCTOR REGION USING ELECTROLYTE WITHOUT ELECTRICAL SOURCE

[75] Inventors: Naobumi Tsuzuki; Tetsu Koji; Kazuo Noguchi, all of Tokyo, Japan

[73] Assignee: Nippon Electric Co., Ltd., Tokyo, Japan

[21] Appl. No.: 738,874

[22] Filed: Nov. 4, 1976

[30] Foreign Application Priority Data

Nov. 5, 1975   Japan ................................. 50-133499

[51] Int. Cl.$^2$ .............................................. B05D 5/12
[52] U.S. Cl. ......................................... 427/85; 427/93;
156/628; 156/648; 156/662; 148/187; 357/49;
204/325; 204/144; 204/141.5; 204/140;
204/147; 204/148
[58] Field of Search ................. 427/85; 156/662, 648,
156/628; 204/32, 144, 141.5, 144.5, 129.75, 130,
146, 147, 148

[56] References Cited

U.S. PATENT DOCUMENTS

| | | | |
|---|---|---|---|
| 3,096,259 | 7/1963 | Williams | 204/15 |
| 3,640,806 | 2/1972 | Watanabe et al. | 204/143 GE |
| 3,689,389 | 9/1972 | Waggener | 204/147 |
| 3,929,529 | 12/1975 | Poponiak | 204/325 |

*Primary Examiner*—John T. Goolkasian
*Attorney, Agent, or Firm*—Hopgood, Calimafde, Kalil, Blaustein & Lieberman

[57] ABSTRACT

A process is disclosed for forming a porous region in a semiconductor device. In the process, a region of a relatively high impurity concentration is formed at a desired region of a semiconductor body of a lower impurity concentration. The semiconductor body is dipped into an electrolyte along with an electrode. The electrode is connected to the semiconductor body, whereby the high impurity concentration region is converted into a porous region.

16 Claims, 4 Drawing Figures

PROCESS FOR FORMING POROUS SEMICONDUCTOR REGION USING ELECTROLYTE WITHOUT ELECTRICAL SOURCE

This invention relates generally to a process for forming a porous silicon region, and more particularly to a process for selectively converting a silicon single crystal into porous silicon.

Porous silicon is extremely high in thermal oxidation rate as well as in impurity diffusing rate, as compared with non-porous single crystal silicon. Therefore, porous silicon can be used to form a thick oxide insulating layer or a deep diffusion layer.

The prior art process for forming a porous region in a semiconductor device includes the steps of: providing a p-type semiconductor layer on the semiconductor substrate; coating a predetermined region of the semiconductor layer with a silicon nitride film; dipping the selectively coated semiconductor substrate and a electrode in an electrolyte such as a hydrofluoric acid solution; connecting the semiconductor substrate to an anode of a power source and the electrode to a cathode of the power source to apply a D.C. positive voltage of a suitable level to the semiconductor substrate; thereby converting the uncoated region of the semiconductor layer into a porous region. According to the prior art process, the shape in plane view and thickness of the porous region largely depend on the density of the current flowing between the semiconductor layer and the cathode electrode, so that there arises the need to accurately control the current density and reaction time. A hydrofluoric acid solution having a strong corrosive force is used as an electrolyte, so that a coating film of only a limited group of a material, such as a silicon nitride film and an alumina film, is allowed to be formed on the semiconductor layer as a mask (anodized resist). The silicon nitride film, however, is not readily etched in a corrosive soultion, so that the formation of the mask requires the use of many steps of applying a silicon oxide film on a silicon nitride film, photolithographically etching the silicon oxide film, and selectively etching the silicon nitride film by use of the remaining silicon oxide film as an etching mask.

In addition, the formation of the porous region advances not only in the direction of depth but also in the direction along the surface i.e., in the lateral direction. The formation of the porous region at the mask edge portion is further enhanced due to the periphery crowding effect of current density, so that the thickness at the mask edge portion of the porous region is increased as compared with that of its central portion, thus resulting in the failure to obtain a porous region of a uniform thickness. Furthermore, defects tend to result particularly in the single crystal region adjacent to the periphery of the porous region, thus presenting causes for noise in a transistor and breaking a PN-junction.

The principal object of the present invention is directed to providing a process for readily forming a porous region having a precisely controlled shape and thickness in a single crystal semiconductor.

The process according to the present invention includes the steps of: forming a high concentration n-type region having an impurity concentration of $1 \times 10^{17}$ to $1 \times 10^{22}$ cm$^{-3}$ in a predetermined area of a single crystal semiconductor body having an impurity concentration of below $1 \times 10^{17}$ cm$^{-3}$; dipping the semiconductor body in an electrolyte together with an electrode; and connecting the semiconductor body to the electrode by way of a connecting means. With this direct connection of the semiconductor body to the electrode without any power source, the high concentration region is predominantly and automatically converted into porous semiconductor. After a suitable period of time when substantially the whole high concentration region is converted into porous semiconductor, the process is terminated by disconnecting the semiconductor body from the electrode or pulling up the semiconductor body from the electrolyte. The conductivity type of the semiconductor body may be either n-type or p-type. However, in the case of an n-type semi-conductor body, it is preferable that the impurity concentration in the high concentration region be within the aforesaid impurity concentration range but over 10 times as high as that of the semiconductor body for the purpose of providing a marked difference in reaction rate between the semiconductor body and the high concentration region. The completion of the formation of porous region is reflected by the density of current flowing through the connecting means, whereas the density of the current is found to be below 1mA/cm$^2$ and should be a value which depends on the impurity concentration of the semiconductor body.

The process according to the present invention dispenses with the supply of current from a specific power source. In addition, a region in which a porous region is to be formed is necessarily limited to a high concentration region. In this respect, there is no need to use any masking material for providing a reacting region. In addition, the adjustment of the current density for reaction is dispensed, because the shape and depth of the porous region obtained do not depend on the current density. The time of completion of a reaction may be detected by the density of current flowing through the connecting means, so that the reaction time may be easily and accurately determined. In contrast, the prior art process requires an adjustment of this reaction time from experience, such that the porous region was not limited to the predetermined region. Since no power source is used, the process of the invention is also devoid of the shortcomings of expanding a porous region in the surface plane over the predetermined region, and increasing the thickness of a porous region in the peripheral portion of a region due to the periphery crowding effect of the reacting current. As a result, the shape and thickness of the porous region can be determined accurately. Still furthermore, there is no danger of breaking single crystal structure in the neighborhood of the porous region thus formed, thereby enabling the desired electrical characteristics of a semiconductor device to be retained, in case the process of the invention is applied to the manufacture of a semiconductor device.

The above and further objects, features and advantages of the present invention will become more apparent from the following detailed description of embodiments taken in conjunction with the accompanying drawings, wherein.

Figure 1:
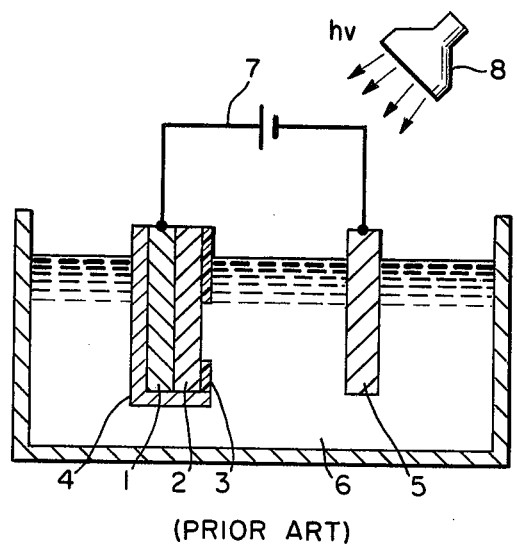
FIG. 1 is a cross-sectional view illustrative of a prior art process for forming a porous region.

Referring now to FIG. 1, there is shown a high concentration n-type silicon substrate 1, on which is formed an n-type silicon epitaxial layer 2 having a specific resistance of about 1Ωcm. A silicon nitride film 3 as a mask covers a region of the epitaxial layer 2 which is not desired to be made porous, and the back surface of the substrate 1 is coated with wax 4. The n-type silicon substrate 1 as an anode and a platinum plate 5 as a cathode are dipped into an electrolyte 6 such as a hydrofluoric acid solution, and a voltage is impressed from a D.C. voltage source 7, under an exposure to light such as from a xenon lamp 8 or the like.

Due to the periphery crowding effect of a reacting current, a porous layer having a uniform thickness may not be achieved. The periphery crowding effect of the reacting current depends on the shape and size of a pattern to be made porous, so that it is quite difficult to determine a suitable current density required for making a pattern porous. In addition, the pure porous substance is formed only in a peripheral portion in which a large current flows due to the periphery crowding effect. Therefore, even when using thermal oxidation, it is difficult to form a porous insulating layer having a uniform quality and thickness. This unreliable quality made the prior porous silicon difficult to apply to a highly reliable semiconductor device. To reduce the periphery crowding effect of a current, there has been proposed an attempt, which has been only partially successful, in which an n-type impurity layer of a high concentration is diffused throughout a region to be made porous, or in which proton implanation is applied. However, the lack of uniformity of the porous quality and thickness attributable to the periphery crowding effect of a current cannot be completely eliminated in the porous region. Further, a process, in which a reaction current is supplied from a specific power supply is inevitably acompanied with an expansion of a porous region in the surface plane.

In this case, a silicon nitride film may be exclusively used as a mask against the anodization. An ordinary photo-resist and a mask of silicon oxide cannot be used, because they are easily etched by the electrolyte such as hydrofluoric acid. In addition, an ordinary photo-resist cannot be used as an etching mask for selectively removing a silicon nitride film. As a result, a silicon oxide film is first formed on a silicon nitride film, and then a photo-resist is applied thereto selectively, so that the aforesaid silicon oxide film may be selectively removed, and the silicon nitride film may be selectively etched with the silicon oxide film being used as an etching mask, thus providing complicated steps. This complicated process causes the positional accuracy of a silicon nitride mask to be lost. In addition, even a silicon nitride film cannot retain its masking effect during the reaction for a long period of time, and is only effective in the reaction within a period of time as short as one minute. For this reason, the formation of a porous layer having a considerable thickness requires the use of a more rigid mask having a high resistance for the electrolyte, thereby resulting in a more difficult and complicated operation in the formation of the masking.

In another prior art process, a p-type silicon layer is used in place of the n-type epitaxial layer 1. In this case, exposure of light can be eliminated but the remaining drawbacks are the same as in the prior art described above.

Figure 2:
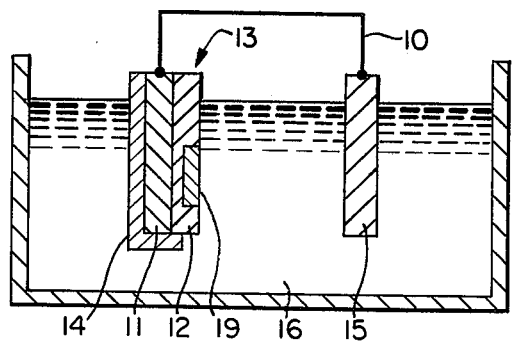
FIG. 2 is a cross-sectional view illustrative of a process for forming a porous region according to the invention.
Figure 3:
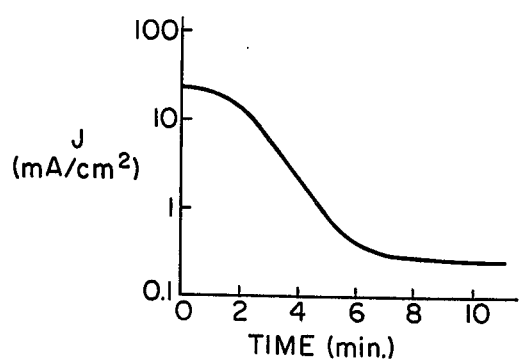
FIG. 3 is a graph showing the relationship between the reacting current and time, according to one embodiment of the invention.

FIG. 2 shows a process for forming a porous semiconductor according to an embodiment of the present invention. As therein shown an n-type silicon epitaxial layer 12 having an impurity concentration of $10^{15}$ cm$^{-3}$ is formed on an n-type silicon substrate 11 having a high impurity concentration, and an n-type high concentration region 19 having a surface impurity concentration of $1 \times 10^{20}$ cm$^{-3}$ is formed on a region of the epitaxial layer which is desired to be made porous, by introducing phosphorous according to an ion implantation process or diffusion process, thereby obtaining a semiprocessed substrate 13. At this time, it is desired to form a porous region having a considerable depth in a relatively small area, to introduce an n-type impurity according to an ion implantation process. In addition, wax 14 is applied to the back surface of the n-type silicon substrate 11 to protect the same from reaction. Even if the impurity concentration of the substrate 11 is lower than $1 \times 10^{17}$ cm$^{-3}$, wax 14 can be omitted. The semiprocessed substrate 13 and an electrode 15 made of platinum or the like are dipped in an electrolyte 16 of a 49 wt% hydrofluoric acid solution, while the semiprocessed substrate 13 is connected to the electrode 15 by way of a metallic conductor 10. Although not shown in FIG. 2, an ammeter is connected between the substrate 13 and the electrode 15 to detect the completion of the process. Under this situation, there is generated a small electromotive force due to a potential difference prevailing on a boundary between the electrolyte 16 and the high concentration region 19, so that a current flows through the metallic conductor 10 for forming a porous region. The initial density of this current depends on the impurity concentration of the high concentration region 19, and, as the process for forming the porous region proceeds, the density of the current decreases. FIG. 3 shows the relationship between the time and the current density flowing through the metallic conductor 10. In this instance, the high concentration region 19 was formed according to a diffusion process. After all the high concentration region 19 has been once converted into a porous region, the density of a current is lowered to a very low level corresponding to that flowing in the case of the reaction between the electrolyte and the n-type silicon epitaxial layer 12, and is thereafter kept unchanged at that low level. When the reaction further proceeds at the aforesaid very low current density level, then the region made porous is oxidized, resulting in peeling of a film due to the electrolytic polishing.

For this reason, the semiprocessed substrate 13 should be quickly removed from the electrolye 16 the moment the density of the current is lowered to a constant low current density level. In this embodiment, the semiprocessed substrate 13 is removed from the electrolyte 16 the instant the current density is lowered to 0.3 mA/cm$^2$.

Figure 4:
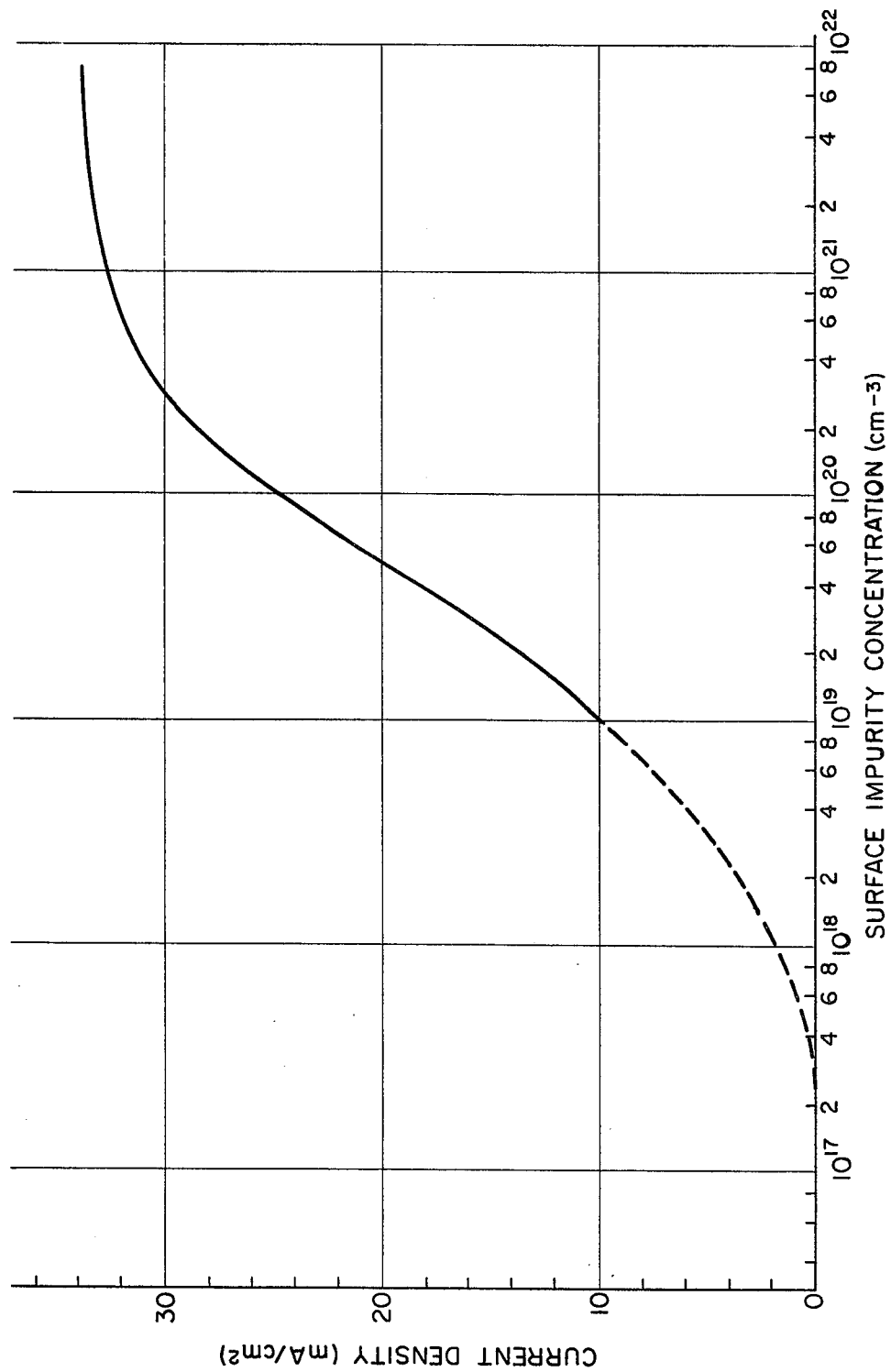
FIG. 4 is a graph showing the relationship of impurity concentration and reacting current.

FIG. 4 shows the relationship between the surface impurity concentration of an n-type silicon to be dipped into the electrolyte 16 and the initial current density. The current density is increased in response to the surface impurity concentration of $1 \times 10^{17}$ cm$^{-3}$ or more, while a reaction for forming a porous region is enhanced with an increase in current density. The surface impurity concentration of less than $1 \times 10^{17}$ cm$^{-3}$ brings about little or no formation of a porous region, while the current density remains at a level as low as 0.3 to 0.5 mA/cm$^{-3}$. The impurity concentration of over $1 \times 10^{22}$ cm$^{-3}$ results in the remarkable occurrence of crystal defects due to the impurity introduction with a high concentration, thus impairing the electric characteristics of a semiconductor device.

In case the reaction for forming a porous region in an area other than the high concentration region is suppressed, or a reacting current density is reduced for retarding a reaction rate, a resistor may be inserted in series with the conductor 10.

The higher the concentration of an electrolyte, the more will the reaction be enhanced. In case an electrolyte contains a halide such as hydrofluoric acid, the concentration of the electrolyte should be over 10 wt%, which falls within a range in which the electrolyte may be dissolved into a water or aqueous solution containing a buffer solution, such as ammonium fluoride, ethylene glycol or the like.

During the reaction, radiation of light from a xenon lamp will promote the reaction of the porous-region formation, while the reaction takes place in a low impurity concentration region, as well. For this reason, the radiation is not preferable. However, it is possible to accelerate the reaction by the radiation. In this case, a mask covering the region to be kept a single crystal structure should be used.

According to the present invention, there is no need to supply a current from any specific power supply, so that the density of a reacting current need not be selected. In addition, the completion of a reaction may be known by detecting the density of a current flowing through the conductor 10, or a change in current density. As a result, there may be achieved easy control of a process and desired reproducibility of the quality, surface pattern and thickness of a porous region. In addition, the process according to the present invention is devoid of the periphery crowding effect of a current, which is caused by supplying an external current, so that a porous region may be uniformly obtained over the entire area of the region, and the desired uniformity of the crystalline quality and thickness may be achieved over the entire area of the porous region.

According to a further feature, regions other than the n-type high concentration impurity region are not subjected to a reaction, so that masking should not be applied to regions other than that required to be made porous.

This may save a masking process, which is significant in the phase of the process in which a solution having a strong corrosive force is treated, from the viewpoint of saving man-hours for a process, and hence reducing processing cost.

The prior art process suffers from disadvantages in that pin holes tend to take place in a mask, so that an unwanted region is made porous, and proceeds in that reaction from an edge of a mask under the mask in the surface plane, thereby expanding the area of the porous region. In contrast in the process of the invention regions other than the high concentration region will not be made porous. As a result, a porous region will not be formed in an unwanted region, nor will the area of a desired porous region be widened.

The porous region thus obtained is extremely active chemically, so that a porous region may be converted into an oxide insulating layer within a short period of time at a temperature as low as 900° C in an oxidizing atmosphere, and the impurity concentration in a semiconductor body will not be changed even after such oxidation process, presenting an insulating layer of a considerable thickness.

The porous insulating film can be used widely in semiconductor devices. One of the preferable applications can be found in a high frequency transistor or the like, which is usually of the NPN type from the viewpoint of high mobility in n-type silicon. In this case, a porous insulating film may be used under an electrode pad to diminish a parasitic capacity produced through the oxide insulating film between an electrode pad and a semiconductor substrate. Taking advantage of a large diffusion factor, a process for forming an isolation region in a semiconductor integrated circuit may be shortenend in time by forming the porous regions at the intended isolation regions and diffusing into porous regions an impurity of an opposite conductivity type to that of the intended island regions in which circuit elements are to be formed. Further, the process according to the invention may be applied not only to an n-type silicon substrate or epitaxial layer but also to p-type ones.

What is claimed is:

1. A process for forming a porous semiconductor comprising the steps of forming a high-concentration region having an impurity concentration of $1 \times 10^{17}$ cm$^{-3}$ to $1 \times 10^{22}$ cm$^{-3}$ in a desired area at a surface of a single crystal semiconductor body, said surface region having an impurity concentration of below $1 \times 10^{17}$ cm$^{-3}$; placing said semiconductor body and an electrode into an electrolyte; and directly connecting said semiconductor body to said electrode, thereby converting said high-concentration region into a porous region.

2. A process for forming a porous semiconductor comprising the steps of forming a high-concentration region having an impurity concentration of $1 \times 10^{17}$ cm$^{-3}$ to $1 \times 10^{22}$ cm$^{-3}$ in a part at a surface of a single crystal semiconductor body having the same conductivity type as said high-concentration region, said surface region having an impurity concentration of below $1 \times 10^{17}$ cm$^{-3}$; placing said semiconductor body and an electrode into an electrolyte; and directly connecting said semiconductor body to said electrode, thereby converting said high-concentration region into a porous region.

3. The process for forming a porous semiconductor as claim in claim 2, wherein the impurity concentration of said high-concentration region is at least ten times as high as that of said surface region.

4. The process for forming a porous semiconductor as claimed in claim 2, wherein said semiconductor body is of silicon.

5. A process for forming a porous semiconductor comprising the steps of forming a high-concentration region having an impurity concentration of $1 \times 10^{17}$ cm$^{-3}$ to $1 \times 10^{22}$ cm$^{-3}$ in a desired area at a surface of a single crystal semiconductor body, said surface region having an impurity concentration of below $1 \times 10^{17}$ cm$^{-3}$; placing said semiconductor body and an electrode into an electrolyte; and connecting said semiconductor body to said electrode by connecting means containing no electrical source, thereby converting said high-concentration region into a porous region.

6. A process for forming a porous semiconductor comprising the steps of forming a high concentration having an impurity concentration of $1 \times 10^{17}$ cm$^{-3}$ to $1 \times 10^{22}$ cm$^{-3}$ in a part at a surface of a single crystal semiconductor body having the same conductivity as said high-concentration region, said surface region having an impurity concentration of below $1 \times 10^{17}\,cm^{-3}$; placing said semiconductor body and an electrode into an electrolyte; and connecting said semiconductor body to said electrode by connecting means containing no electrical source, thereby converting said high-concentration region into a porous region.

7. The process for forming a porous semiconductor as claimed in claim 6, wherein said impurity concentration of said high-concentration region is at least 10 times as high as that of said surface region.

8. The process for forming a porous semiconductor as claimed in claim 6, wherein said semiconductor body is of silicon.

9. A process for forming a porous semiconductor comprising the steps of forming a high-concentration region having an impurity concentration of $1 \times 10^{17}\,cm^{-3}$ to $1 \times 10^{22}\,cm^{-3}$ in a desired area at a surface of a single crystal semiconductor body, said surface region having an impurity concentration of below $1 \times 10^{17}\,cm^{-3}$; placing said semiconductor body and an electrode into an electrolyte; and connecting said semiconductor body to said electrode by resistive means, thereby converting said high-concentration region into a porous region.

10. A process for forming a porous semiconductor comprising the steps of forming a high-concentration region having an impurity concentration of $1 \times 10^{17}\,cm^{-3}$ to $1 \times 10^{22}\,cm^{-3}$ in a part at a surface of a single crystal semiconductor body having the same conductivity type as said high-concentration region, said surface region having an impurity concentration of below $1 \times 10^{17}\,cm^{-3}$; placing said semiconductor body and an electrode into an electrolyte; and connecting said semiconductor body to said electrode by resistive means, thereby converting said high-concentration region into a porous region.

11. The process for forming a porous semiconductor as claimed in claim 10, wherein said impurity concentration of said high-concentration region is at least ten times as high as that of said surface region.

12. The process for forming a porous semiconductor as claimed in claim 10, wherein said semiconductor body is of silicon.

13. A process for converting a single crystal semiconductor into a porous semiconductor, comprising the steps of:
forming an n-type high-concentration region having an impurity concentration of $1 \times 10^{17}$ to $1 \times 10^{22}\,cm^{-3}$ in a desired area at a surface region of a single crystal semiconductor body, said surface region having an impurity concentration of below $1 \times 10^{17}\,cm^{-3}$;
placing said semiconductor body and an electrode into an electrolyte; and
directly connecting said semiconductor body to said electrode, thereby converting said high-concentration region into a porous region.

14. The process as set forth in claim 13, wherein said impurity concentration of said high concentration region is at least ten times as high as that of the impurity concentration of said surface region.

15. The process as set forth in claim 13, wherein said electrolyte is an aqueous solution of a halide, the concentration of said halide being at least 10wt% but below the saturated concentration.

16. A process for forming a porous insulating material, comprising the steps of:
forming an n-type high-concentration region having an impurity concentration of $1 \times 10^{17}$ to $1 \times 10^{22}\,cm^{-3}$ in a desired area of a surface region of a single crystal semiconductor body, said surface region having an impurity concentration of below $1 \times 10^{17}\,cm^{-3}$;
dipping said semiconductor body and an electrode into an electrolyte;
directly connecting said semiconductor body to said electrode, thereby making said high-concentration region porous; and
heating said semiconductor body in an oxidizing atmosphere, thereby converting the porous region into an oxide.

* * * * *